(12) United States Patent
Pinarbasi (10) Patent No.: US 6,197,164 B1
(45) Date of Patent: *Mar. 6, 2001

(54) METHOD AND APPARATUS TO IMPROVE THE UNIFORMITY OF ION BEAM DEPOSITED FILMS IN AN ION BEAM SPUTTERING SYSTEM

(75) Inventor: Mustafa Pinarbasi, Morgan Hill, CA (US)

(73) Assignee: International Business Machines Corporation, Armonk, NY (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

This patent is subject to a terminal disclaimer.

(21) Appl. No.: 08/949,064

(22) Filed: Oct. 10, 1997

(51) Int. Cl.[7] .................................................. C23C 14/46
(52) U.S. Cl. ...................... 204/192.11; 204/192.2; 204/298.04; 204/298.11; 204/192.13; 204/298.03
(58) Field of Search ........................... 204/192.11, 192.2, 204/298.04, 298.11, 298.15, 298.23, 298.28, 192.13, 298.03

(56) References Cited

U.S. PATENT DOCUMENTS

| 4,303,489 | * | 12/1981 | Morrison, Jr. ................ | 204/298.11 |
| 4,315,960 | * | 2/1982 | Ohji et al. ..................... | 204/298.11 |
| 4,793,908 | | 12/1988 | Scott et al. .................... | 204/192.26 |
| 4,923,585 | | 5/1990 | Krauss et al. ................. | 204/298.04 |
| 5,492,605 | * | 2/1996 | Pinarbasi ....................... | 204/192.11 |
| 5,672,252 | | 9/1997 | Hayashi et al. ............... | 204/192.22 |
| 6,086,727 | * | 7/2000 | Pinarbasi ....................... | 204/192.11 |

FOREIGN PATENT DOCUMENTS

| 61-124568 | | 6/1986 | (JP) | ................ | C23C/14/46 |
| 2-97673 | | 4/1990 | (JP) | ................ | C23C/14/46 |
| 2-251143 | * | 10/1990 | (JP) . | | |
| 3-202466 | * | 9/1991 | (JP) | ................ | 204/298.11 |
| 4-308083 | * | 10/1992 | (JP) | ................ | 204/298.04 |
| WO 92/16014 | * | 9/1992 | (WO) | ................ | 204/192.11 |

OTHER PUBLICATIONS

Translation of Okazaki Japan 02–251143, Oct. 1990.*

Motohiro, T. et al., "Angular–Resolved Ion–Beam Sputtering Apparatus for Large–Area Deposition", vol. 60, No. 8, Aug. 1989, pp. 2657–2665.

European Search Report dated Sep. 30, 1999 for 98307422.

* cited by examiner

Primary Examiner—Rodney McDonald
(74) Attorney, Agent, or Firm—Altera Law Group, LLC (57) ABSTRACT

An ion beam sputtering system having a chamber and a target, a substrate, and a movable flux regulator located between the target and the substrate in the chamber. The position of the movable flux regulator relative to the deposition substrate affects the thickness uniformity of thin films deposited on the substrate in the ion beam sputtering system.

57 Claims, 11 Drawing Sheets

METHOD AND APPARATUS TO IMPROVE THE UNIFORMITY OF ION BEAM DEPOSITED FILMS IN AN ION BEAM SPUTTERING SYSTEM

BACKGROUND OF THE INVENTION

1. Field of the Invention

This invention relates generally to the fabrication of thin films by ion beam sputter deposition and, more particularly, to the fabrication of multilayered thin film structures such as magnetoresistive sensors wherein the thickness uniformity of multiple layers deposited on a substrate are controlled by controlling the atom flux deposited on the substrate.

2. Description of Related Art

It is well-known in the prior art to utilize RF or DC magnetron sputter-deposition apparatus for fabrication of thin film devices such as magnetic recording sensors and storage media. Such sputter devices are characterized by crossed electric and magnetic fields in an evacuated chamber into which an inert, ionizable gas, such as argon, is introduced. The gas is ionized by electrons accelerated by the electric field, which forms a plasma in proximity to a target structure. The crossed electric and magnetic fields confine the electrons in a zone between the target and substrate structures. The gas ions strike the target structure, causing ejection of atoms that are incident on a workpiece, typically a substrate on which it is desired to deposit one or more layers of selected target materials.

In the prior art conventional sputtering devices relatively high operating pressures are utilized in order to obtain films having low internal stress which results in non-directional sputtering flux at the substrate. However, this non-directional flux introduces manufacturing process difficulties as device dimensions become increasingly smaller.

It is known in the prior art to utilize ion beam sputter deposition in certain applications to overcome some of the difficulties encountered with conventional RF/DC sputter techniques. Several aspects of ion beam sputter deposition differ from conventional sputter processes and provide significant advantages. For example, (1) the use of low background pressure results in less scattering of sputtered particles during the transit from the target to the substrate; (2) control of the ion beam directionality provides both a variable angle of incidence of the beam at the target and a controllable angle of deposition at the substrate; (3) a nearly monoenergetic beam having a narrow energy distribution provides control of the sputter yield and deposition process as a function of ion energy and enables accurate beam focusing and scanning; and (4) the ion beam is independent of target and substrate processes which allows changes in target and substrate materials and geometry while maintaining constant beam characteristics and allowing independent control of the beam energy and current density.

Apparatus and methods for producing a thin film deposit on a substrate utilizing ion beam sputtering are described, for example, in U.S. Pat. No. 4,923,585 ('585) to Krauss et al. and in U.S. Pat. No. 5,942,605 to Pinarbasi ('605), the contents of which are incorporated herein by reference. Krauss et al discloses the use of a computer controlled, single ion beam with a quartz crystal monitor to produce deposited films of arbitrary composition as well as layered structures of arbitrary thickness from multiple targets of elemental components of the desired films and layered structures. Pinarbasi discloses matching the ion beam gas atomic mass to the target material atomic mass to provide thin films having densities and physical properties very close to their bulk property values. Both the mass of the ion beam sputtering gas and the energy of the ion beam is controlled as a function of the target material to provide single-layered and multilayered structures wherein selected properties of each layer are optimized to provide specific function for each layer in the resulting structure. While the '585 and '605 patents disclose methods for depositing multilayer films and controlling the physical properties, the problems of controlling and improving the thickness uniformity across the wafer of each individual layer deposited are not addressed.

Ion beam sputter deposition systems have been utilized to deposit individual layers of anisotropic magnetoresistive (AMR) sensors and giant magnetoresistive (GMR) sensors for use in magnetic recording devices. In the GMR sensors, for example, the resistance of the magnetoresistive (MR) sensing layer varies as a function of the spin-dependent transmission of the conduction electrons between the ferromagnetic layers separated by a non-magnetic layer (spacer) and the accompanying spin-dependent scattering which takes place at the interface of the ferromagnetic and non-magnetic layers and within the ferromagnetic layers. GMR sensors using only two layers of ferromagnetic material (e.g., NiFe or Co or NiFe/Co) separated by a layer of GMR promoting non-magnetic metallic material (e.g., copper) are generally referred to as spin valve (SV) sensors.

Magnetoresistive (MR) sensors (AMR or GMR) are very small devices that are generally fabricated by sputtering depositions on large wafer substrates which are generally larger than 5 inches in diameter to form thousands of sensors that will be subsequently separated (diced) to form individual magnetic read transducers for use in magnetic storage devices.

One of the critical issues in the fabrication process of MR sensors is the thickness uniformity of each and every deposited layer over the entire utilized area of the wafer in order to control the uniformity of operating characteristics (for example, resistance and magnetoresistance) of the entire batch of the MR sensors fabricated on the wafer substrate.

In an experiment by the present applicant, an ion beam sputtering system (FIG. 1) having a non-movable flux regulator was developed and used to build SV sensors 200 (FIG. 2) on a 5 inch diameter wafer substrate (FIG. 3) in order to measure the uniformity of physical properties of the various sputtered layers (therefore, uniform thickness).

Figure 1:
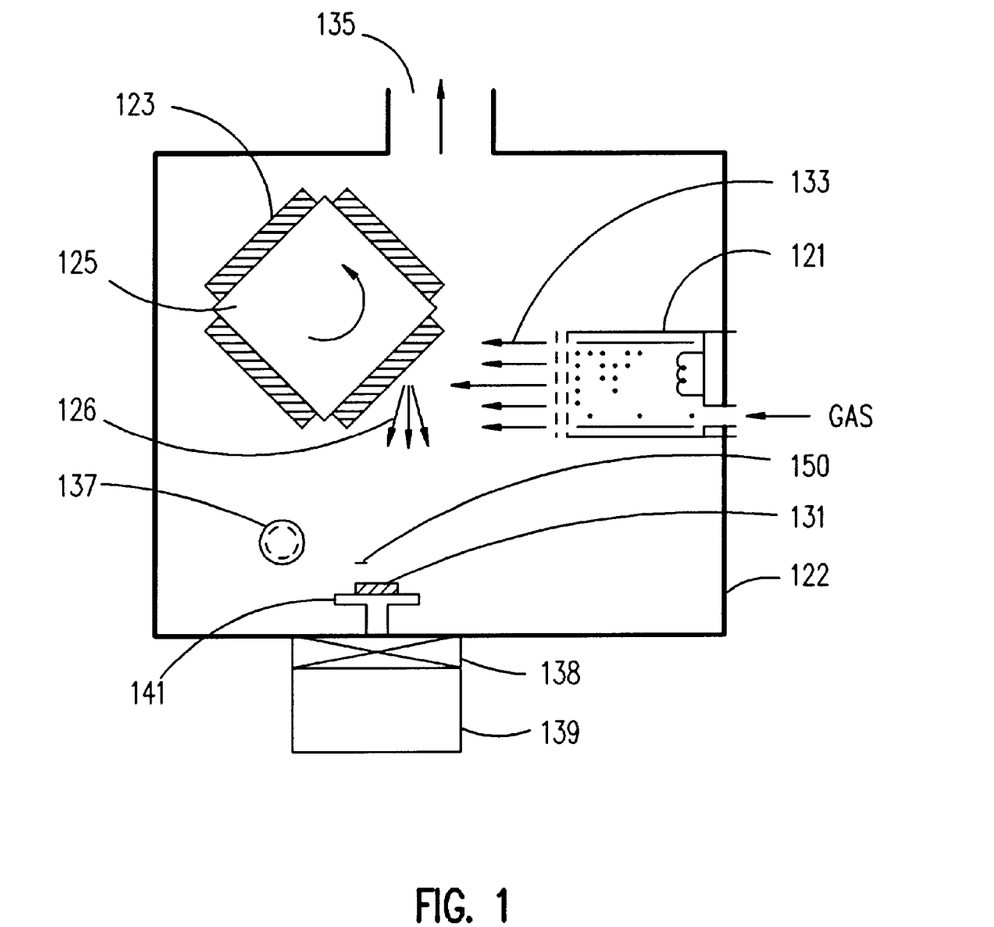
FIG. 1 is a block diagram of an ion beam sputtering deposition system having fixed flux regulator.

Referring to FIG. 1, there is shown a simplified diagram illustrating the ion beam sputter deposition system 120 developed and used by the Applicant. The ion beam sputter deposition system 120 includes a vacuum chamber 122 in which an ion beam source 121 is mounted. The ion beam system 120 further comprises a target 123 and a workpiece (also referred to as a deposition substrate or wafer substrate) 131. An ion beam 133 provided by the ion source 121 is directed at the target 123 where the impacting ions cause sputtering of the target material. System 120 further included selectable multiple targets 123 on a rotary target support 125. The sputtered atoms 126 emitted from the target material is directed onto a deposition substrate 131 on which is formed a layer of the target material.

A thickness monitor 137 positioned closely adjacent to the substrate 131 provides real-time, in-situ monitoring of the thickness of the growing film during deposition. A non-movable flux regulator 150 fixed in front of the deposition substrate 131 partially blocks the sputtered atom flux and is used in conjunction with rotation of the deposition substrate 131 to improve thickness uniformity of the deposited layer. Applicant's non-movable flux regulator refers to a flux regulator that its positioned was fixed prior to the ion beam sputtering deposition of one or more deposited layers and never changed during the deposition of said one or more deposited layers. The substrate or other workpiece 131 is mounted on a movable pedestal or support member 141 which is retrieved into a loading port 139 via a gate valve 138 for changing the workpiece 131. A magnetic field may also be applied at the workpiece 131 if required for the particular structure being deposited. The pedestal 141 may also be rotated, using a rotary/linear motor, during deposition to rotate the deposition substrate 131. During operation of the ion beam sputter deposition system, the vacuum chamber 122 is maintained at suitable low pressure by a vacuum pump (not shown) via port 135.

Figure 2:
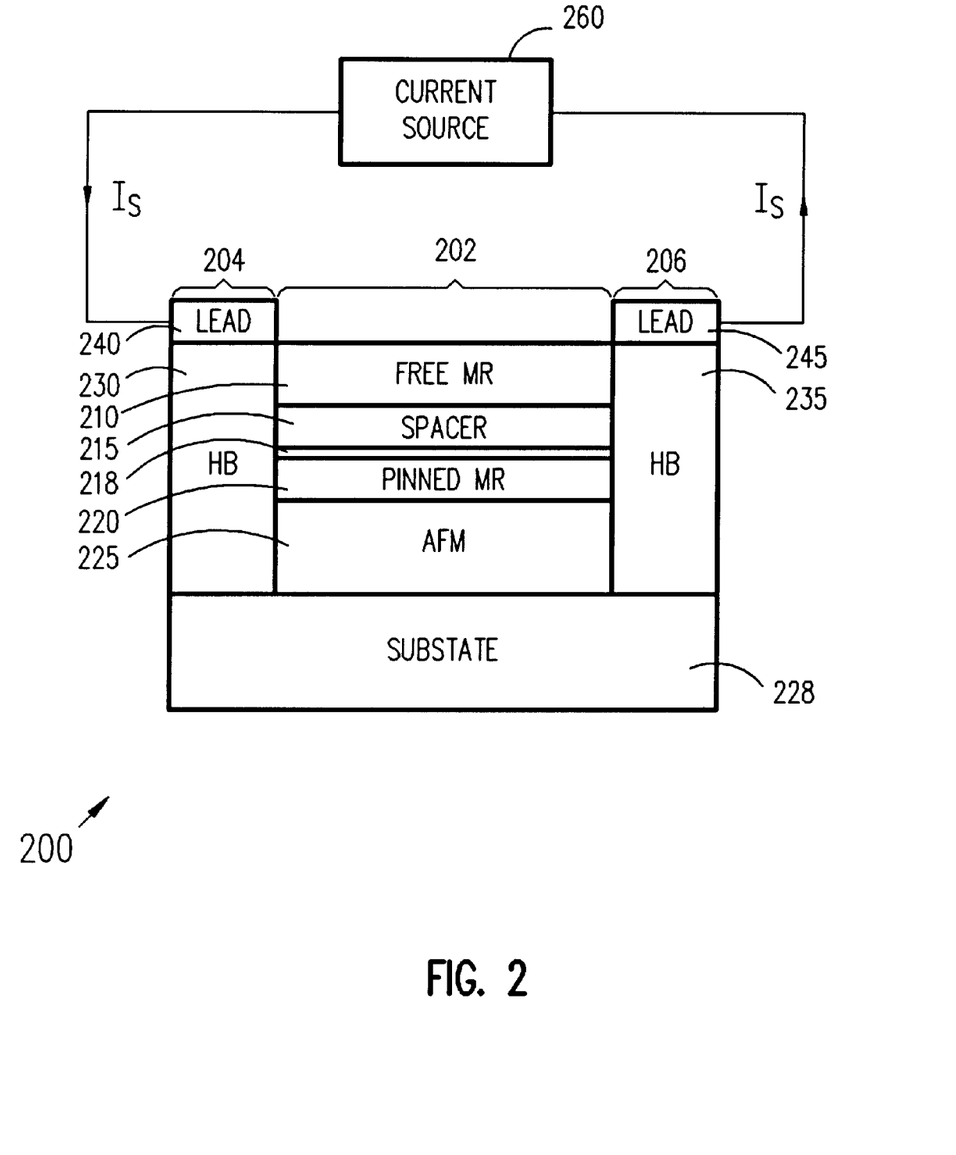
FIG. 2 is an air-bearing surface view, not to scale, of a SV sensor.

FIG. 2 shows the SV sensor 200 manufactured using Applicant's ion beam sputtering system 120. SV sensor 200 comprises end regions 204 and 206 separated by a central region 202. A free layer (free MR layer, free ferromagnetic layer) 210 is separated from a pinned layer (pinned MR layer, pinned ferromagnetic layer) 220 (which may include a very thin Co interface layer 218) by a non-magnetic, electrically-conducting spacer layer 215. Alternatively, pinned layer 220 may be made of multi layers of ferromagnetic material (e.g., cobalt, Nife) separated from each other by a metallic non-magnetic conductor (e.g., ruthenium). Such a multi-layer pinned layer is generally referred to as anti-parallel (AP) pinned layer. The magnetization of the pinned layer 220 is generally, although not necessarily, is fixed through exchange coupling with an antiferromagnetic (AFM) layer 225. The AFM layer 225, is generally made of NiMn, FeMn or NiO. The magnetization of the free layer, however, is free to rotate in response to an external field. Free layer 210, spacer layer 215, pinned layer 220 and the AFM layer 225 (if used) are all formed in the central region 202 over the substrate 228. Hard bias layers 230 and 235 formed in the end regions 204 and 206, respectively, provide longitudinal bias for the MR free layer 210. Leads 240 and 245 formed over hard bias layers 230 and 235, respectively, provide electrical connections for the flow of the sensing current Is from a current source 260 to the MR sensor 200.

Figure 3:
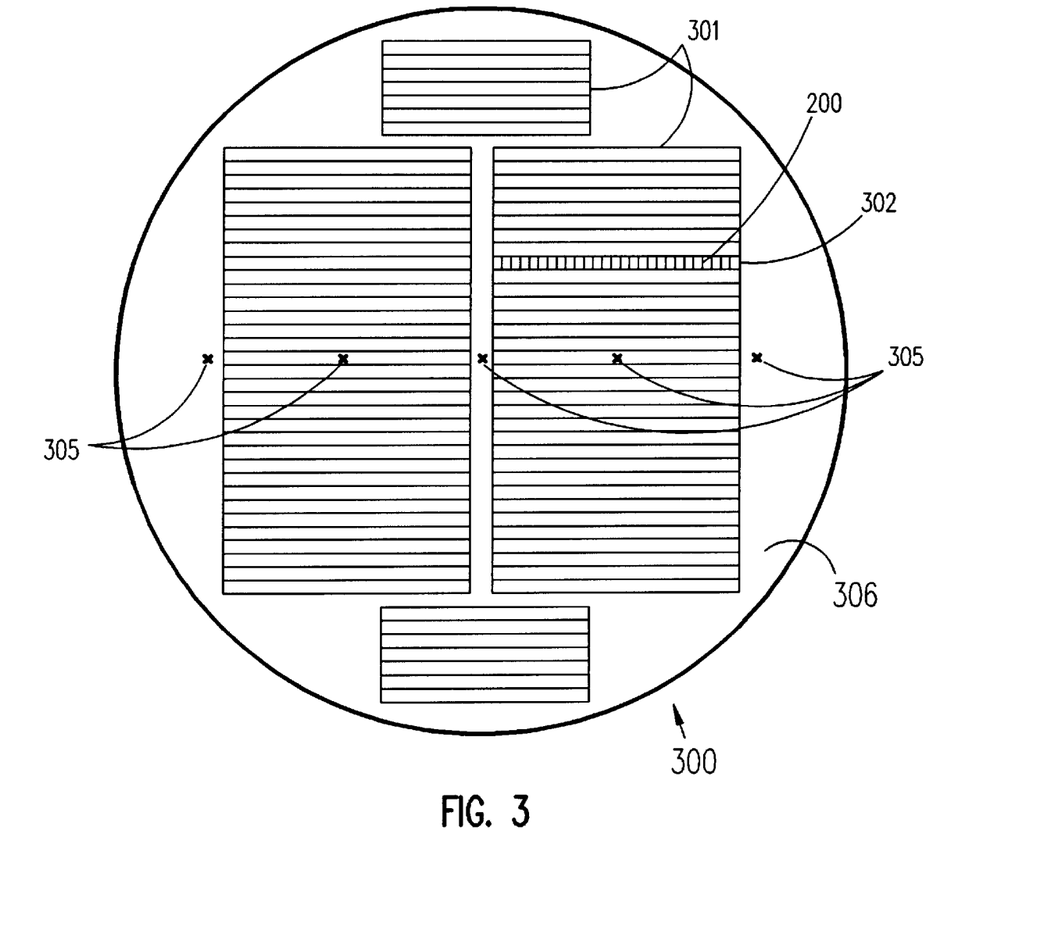
FIG. 3 is a plan view of a wafer showing the general pattern of SV sensors formed on the wafer.

FIG. 3 shows a wafer 300 manufactured by Applicant's ion beam sputtering system for making SV sensors 200. FIG. 3 illustrates schematically the general pattern of several blocks 301, each block comprising a plurality of rows 302. Each of the rows 302 comprises a plurality of SV sensors 200 disposed along each row and formed on the wafer substrate 306.

As mentioned earlier, Applicant conducted an experiment in which the ion beam sputtering system 120 was used to build SV sensors 200 on the wafer substrate 306. In doing so, layers of sputtered material comprising the layer structure of the central region 202 of the SV sensor 200 were individually deposited and their uniformities were measured by measuring the sheet resistance of the film at the five positions 305 indicated on the five inch diameter of the wafer 300. The uniformity of the sheet resistance which is representative of the film thickness uniformity across the wafer can be expressed as a percent uniformity. The percent uniformity is a measure of the maximum variation of film thickness that will be seen on a given wafer.

Figure 4:
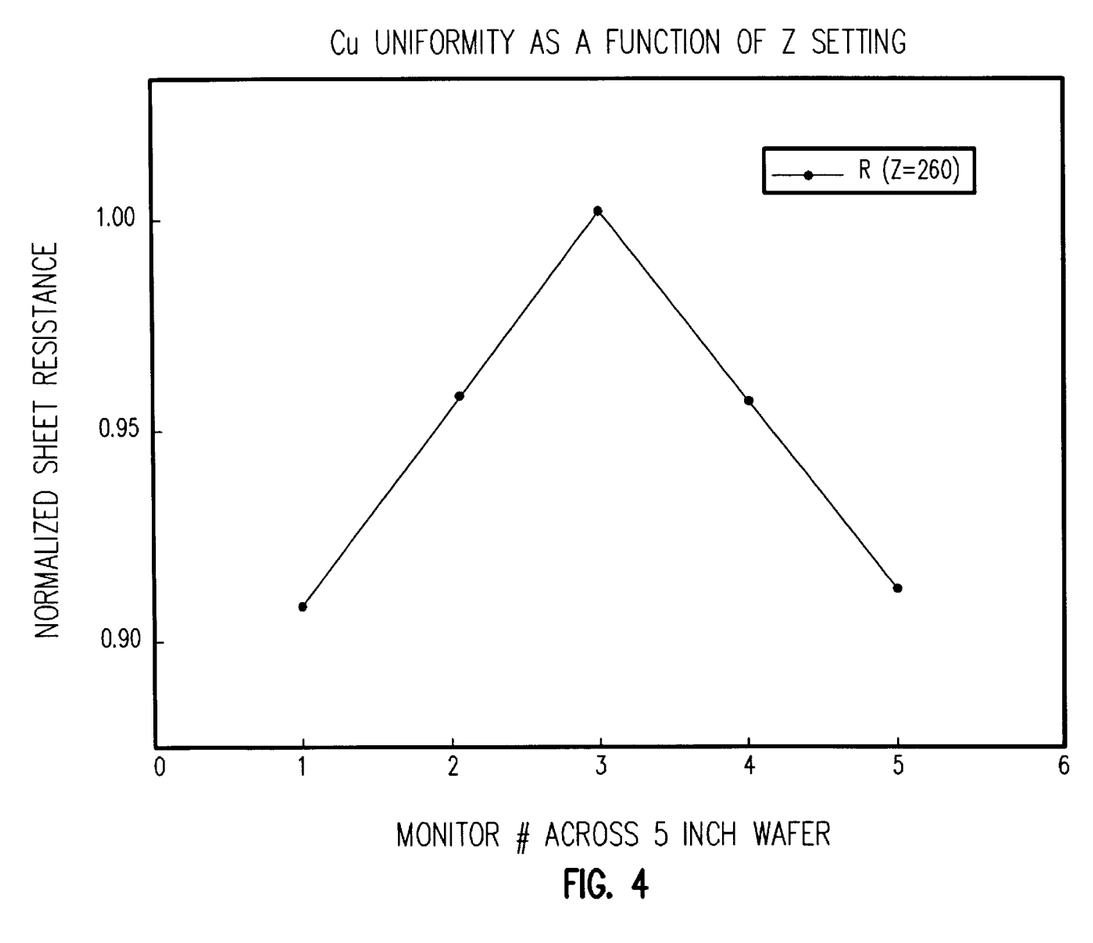
FIG. 4 is a graph showing the variation of sheet resistance of a copper layer across a wafer fabricated using the ion beam sputtering system of FIG. 1.

FIG. 4 is a graph showing the normalized sheet resistance of the Cu spacer film 215 of the SV sensor 200 measured at five positions 305 across the 5 inch diameter wafer 300. For the data of FIG. 4, the Cu film thickness varied by as much as 11.3% across the wafer 300. The sheet resistance of the NiFe and Co layers of the SV sensor 200 were also measured at the same five locations 305 across the wafer 300. It was observed that the NiFe and Co layers' thicknesses varied by about 3.5% and 2.7%, respectively.

In MR sensors the thickness of each of the thin film layers in the multilayer structure is critical to proper operation of the sensor. Variations of 11.3% in the thickness of the Cu spacer film across the wafer means that many of the MR sensors on wafer 300 fail to work properly or have unacceptably large variations in their responses. Also, as the size of the wafer increases to improve productivity, the problem of achieving film uniformity across the wafer becomes worse. The prior art does not address the need for control of the thickness uniformity of the individual thin layers deposited over the entire area of the wafer to ensure the desired device performance for an entire batch of magnetic devices fabricated with an ion beam deposition system.

Therefore, there is a need for an invention of a method and apparatus for controlling the thickness uniformity of individual films of a multilayer thin film structure deposited on a wafer substrate in an ion beam sputtering system.

There is a further need for an invention disclosing a method and apparatus to control the thickness of individual layers of the multilayer structures of MR sensors deposited on a wafer substrate in an ion beam sputtering system.

SUMMARY OF THE INVENTION

It is an object of the present invention to disclose an ion beam sputtering system having a movable flux regulator that affects the thickness uniformity of deposited layers across the wafer (deposition) substrate.

It is another object of the present invention to disclose an ion beam sputtering deposition process using a movable flux regulator to improve the thickness uniformity of each individual layer of deposited material.

It is a further object of the present invention to disclose an ion beam sputtering deposition process for depositing MR (AMR, GMR or SV) sensors with improved thickness uniformity of each of the individual layers of the multilayer structures deposited on a wafer substrate.

Briefly stated, according to one aspect of the Applicant's invention, a flux regulator element located between the target and the substrate in an ion beam sputter deposition chamber is movable relative to the substrate in each of the three orthogonal X, Y and Z Cartesian directions. According to another aspect of the Applicant's invention, the flux regulator is capable of rotation along its longitudinal axis. According to another aspect of the Applicant's invention, the flux regulator is capable of swinging in a plane of a predefined axis through a predefined angle. According to yet another aspect of the Applicant's invention, the flux regulator is capable of moving in each of the three orthogonal X, Y, and Z Cartesian directions and/or capable of rotating along its longitudinal axis and/or capable of swinging in a plane of a predefined axis. The position of the movable flux regulator relative to the deposition substrate affects the thickness uniformity of thin films deposited on the substrate by the ion beam sputtering process. The best position of the movable flux regulator for any material to be sputter deposited in a particular ion beam sputter deposition apparatus is determined by carrying out a series of depositions of that material in the system while changing the position (through X, Y, Z direction and/or rotation and or swinging) of the flux regulator for each deposition made and subsequently measuring the thickness (or a thickness dependent property such as sheet resistance) across the wafer diameter. The best position of the movable flux regulator has been found to be different for different materials deposited from different targets in the same ion beam system. Therefore, this invention discloses a means and method to move the movable flux regulator to a predetermined position for each material deposited on a wafer in a multilayer structure in order to achieve improved uniformity of each deposited layer over the entire utilized wafer substrate. Applicant's movable flux regulator refers to a flux regulator that its position, relative the wafer substrate, can be changed depending on the material being deposited.

As stated earlier, the fabrication of MR sensors in general and SV sensors in particular requires formation of a large number of sensors with uniform properties across the entire wafer. The uniformity of the SV sensor properties is critically dependent on thickness uniformity of each of the films deposited in these multilayer sensors. This invention discloses a means and method of controlling the thicknesses of each film of material deposited on a wafer substrate with an ion beam sputtering deposition system to achieve uniform properties of SV sensors across the entire wafer.

BRIEF DESCRIPTION OF THE DRAWINGS

For a fuller understanding of the nature and advantages of the present invention, as well as the preferred mode of use, reference should be made to the following detailed description read in conjunction with the accompanying drawings.

DETAILED DESCRIPTION OF THE PREFERRED EMBODIMENT

The following description is the best embodiment presently contemplated for carrying out the present invention. This description is made for the purpose of illustrating the general principles of the present invention and is not meant to limit the inventive concepts claimed herein.

Figure 5:
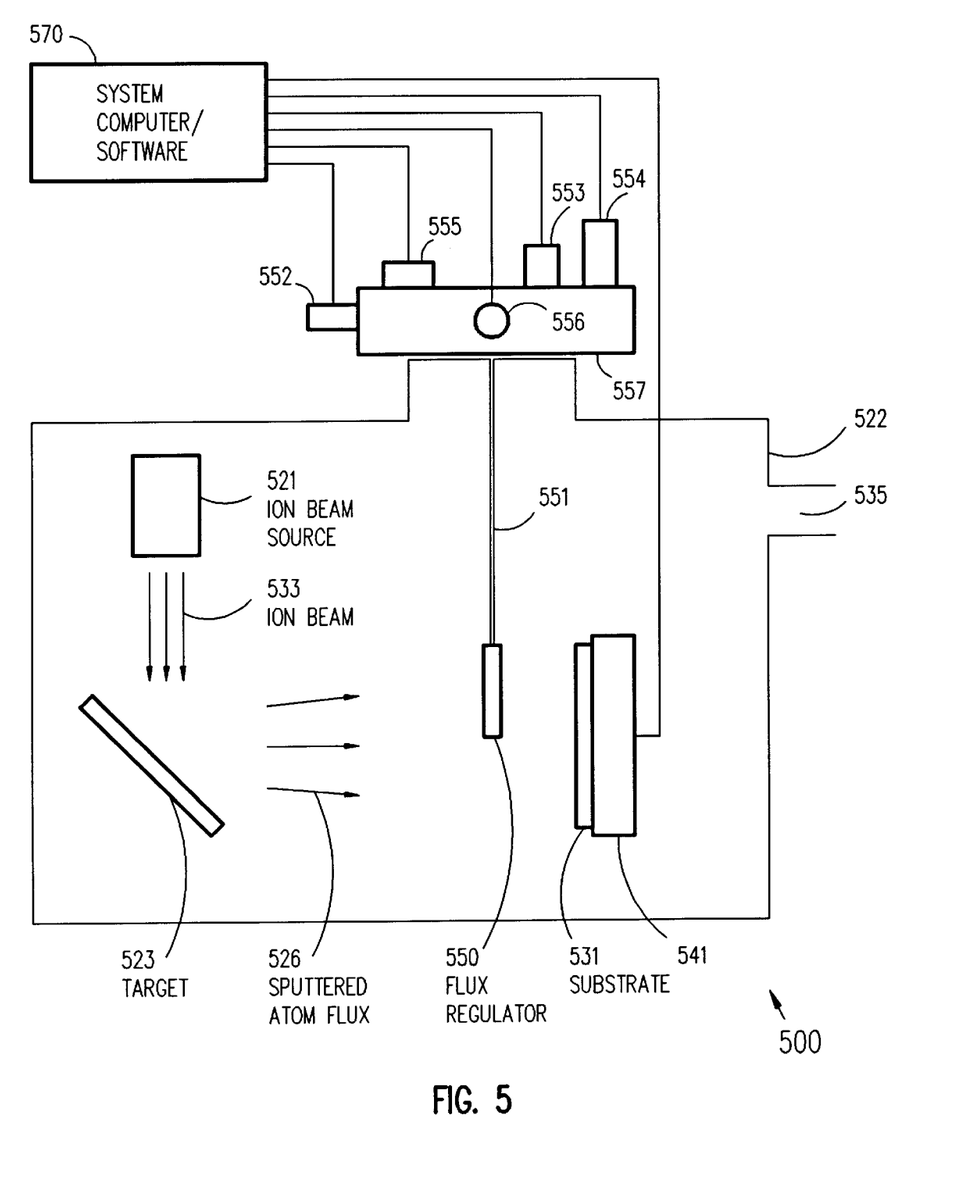
FIG. 5 is a block diagram of the preferred embodiment of an ion beam sputtering system having a movable flux regulator according to the present invention.

Referring now to FIG. 5, there is shown a partial view of the ion beam sputtering system 500 of the present invention having a movable flux regulator 550 and its positioning and control elements. The movable flux regulator 550 may also be referred to as a movable flux shaper, a movable flux modifier, a movable flux blocker or a movable flux controller or any other suitable term describing its function of moving and modifying the flux distribution incident on the substrate. The ion beam system 500 comprises a vacuum chamber 522 exhausted to a suitable low pressure by a vacuum pump (not shown) via port 535, an ion beam source 521 directing energetic ions 533 at a target 523 of the material to be sputter deposited on a wafer substrate 531 mounted on a rotatable stage 541. The movable flux regulator 550, mounted on a supporting element 551, is positioned between the target 523 and the substrate 531 so as to partially block the sputtered atom flux 526 from colliding with the substrate 531. The flux regulator 550 of the present invention is movable relative to the substrate 531 by means of the movable supporting element (shaft) 551 which is fixed to a positioner 557 which is generally external to the vacuum chamber 522. In the preferred embodiment, the positioner 557 is fitted with three orthogonal linear drive systems; an X-direction drive 552, a Y-direction drive 553, and a Z-direction drive 554. The positioner 557 is also fitted with a forth drive system 555 for swinging the flux regulator 550 in the plane of a predefined axis through a predefined angle Θ (FIG. 6c). The positioner 557 may also be fitted with a fifth drive system 556 for rotating the flux regulator along its longitudinal axis (FIG. 6b). According to the preferred embodiment of the present invention, the drive systems are controlled by a computer system 570 programmed by software to move the flux regulator 550 to a predetermined position during a film deposition sequence.

Figure 6A:
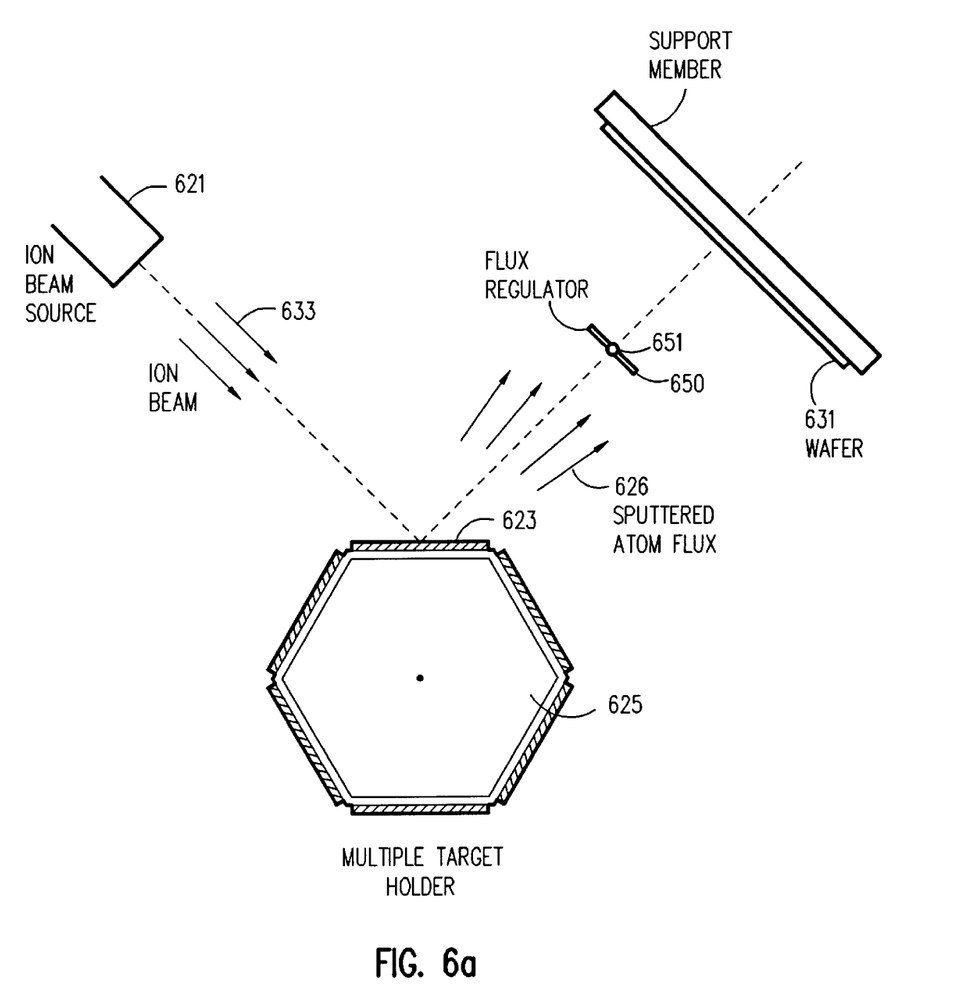
FIG. 6a is a drawing showing the top view of the movable flux regulator positioned between the target and substrate in an ion beam sputtering system of the present invention.
Figure 6B:
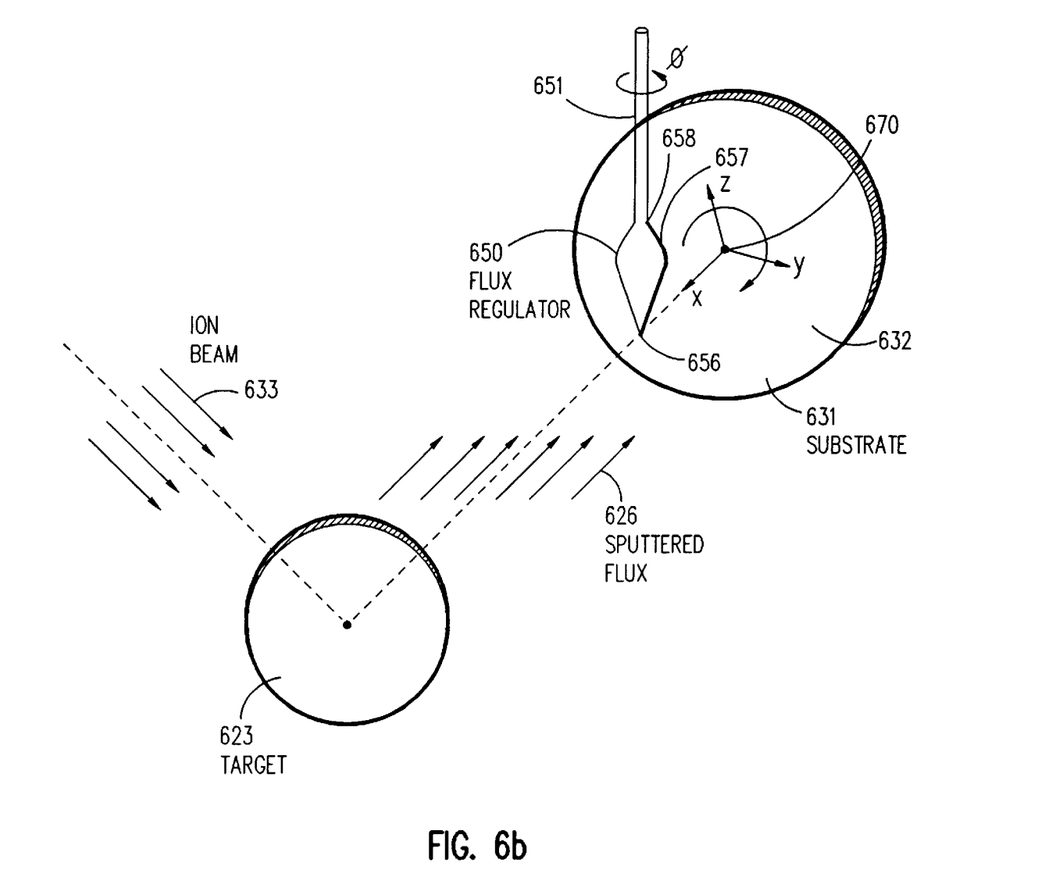
FIG. 6b is a drawing showing a perspective view of the preferred shape of the movable flux regulator of the present invention positioned between the target and substrate in an ion beam sputtering system.
Figure 6C:
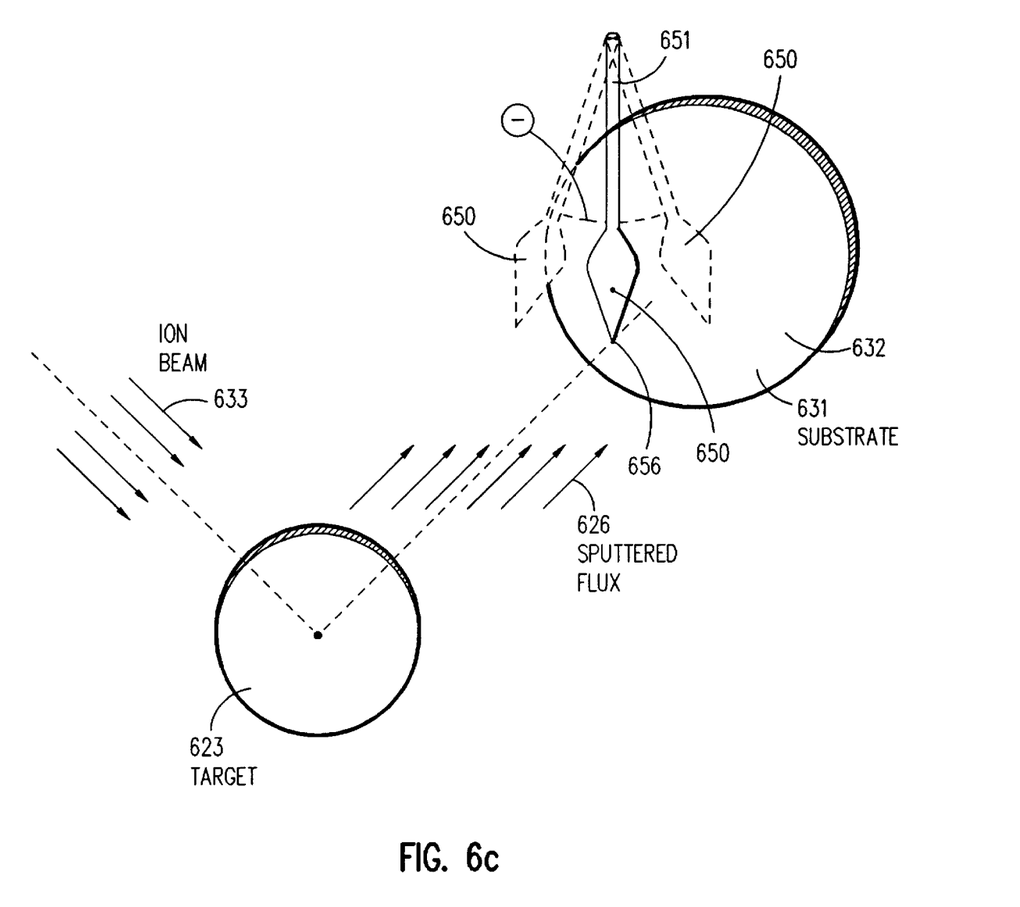
FIG. 6c is a drawing showing a perspective view of the preferred shape of the movable flux regulator of the present invention positioned between the target and substrate in an ion beam sputtering system swinging through angle Θ.

Referring now to FIGS. 6a, 6b, and 6c there is shown a movable flux regulator 650 of an ion beam sputtering deposition system of the present invention in a generalized position between a target 623 and a wafer (deposition) substrate 631. The ion beam source 621 produces an ion beam 633 that is directed to one target 623 mounted on a multiple target holder 625. The movable flux regulator 650 is a shaped element generally located between the sputtering target 623 and the deposition substrate 631 where it is positioned for the purpose of partially blocking the sputtered atom flux 626 from the target 623 that is directed at the substrate 631. The purpose of the movable flux regulator 650 is to modify the sputtered atom flux incident on the substrate so as to enable adjustment of the amount of material deposited across the whole wafer. Proper operation of the movable flux regulator 650 depends on the rotation of the substrate 631 about an axis perpendicular to the substrate surface 632 (FIG. 6b). That is, the rotation of the substrate 631 is required in order to average the incident sputtered atom flux about the rotation axis of the substrate 631. Because the incident atom flux is generally highest at the center of the substrate, the preferred shape of the movable flux regulator 650, illustrated in FIG. 6b, is an arrowhead-like shape whose width increases gradually from the tip 656 to a maximum width 657 and then gradually decreases (tapering off) to the width of the supporting shaft 658. This shape results in greater blockage of the atom flux at the inner radii of the substrate 631 than at the outer radii. The fraction of the sputtered atom flux 626 blocked by the flux regulator 650 at any radial position on the substrate 631 is given approximately by the ratio of the movable flux regulator 650 width at that radius to the circumference of the substrate 631 at that radius. The shape of the movable flux regulator 650 need not be symmetric as illustrated in FIGS. 6b, and 6c since only the projection of its width normal to the sputtered atom flux direction is important.

The movable flux regulator 650 may also be rotated about the length axis of the mounting shaft 651 (longitudinal axis of the flux regulator) as indicated by the rotation angle φ shown in FIG. 6b. As the plane of the flux regulator 650 is rotated from perpendicular to the sputtered atom flux direction, the projection of its width on the substrate surface 632 decreases resulting in blockage of less of the sputtered atom flux 626 directed at the substrate surface 631. The movable flux regulator 650 may also swung in a plane of a predefined axis (X-axis, Y-axis or Z-axis) through a predetermined angle Θ (FIG. 6c).

In the preferred embodiment of the present invention, the position of the movable flux regulator in the X-direction, Y-direction and Z-direction is adjusted for each film layer material to be sputter deposited. Experiments ran by the present inventor, fixed the X-direction and Y-direction positions of the movable flux regulator 650 based on the target 623 and substrate 631 geometry of the ion beam sputtering system. Specifically, in the X-direction the movable flux regulator was positioned approximately 3 cm in front of the substrate deposition surface, while in the Y-direction the movable flux regulator was positioned at the mid position 670 across the substrate diameter. Ion beam sputtering depositions of films of different materials were made with movable flux regulator Z-axis position adjusted for each material to improve the uniformity of the deposited layer of each material. Accordingly, the present invention discloses a process for adjusting the position of the movable flux regulator for each material deposited in a multilayer deposition process in order to improve the uniformity of each layer deposited and the uniformity across the substrate of the combined layers forming the MR sensors.

Figure 7:
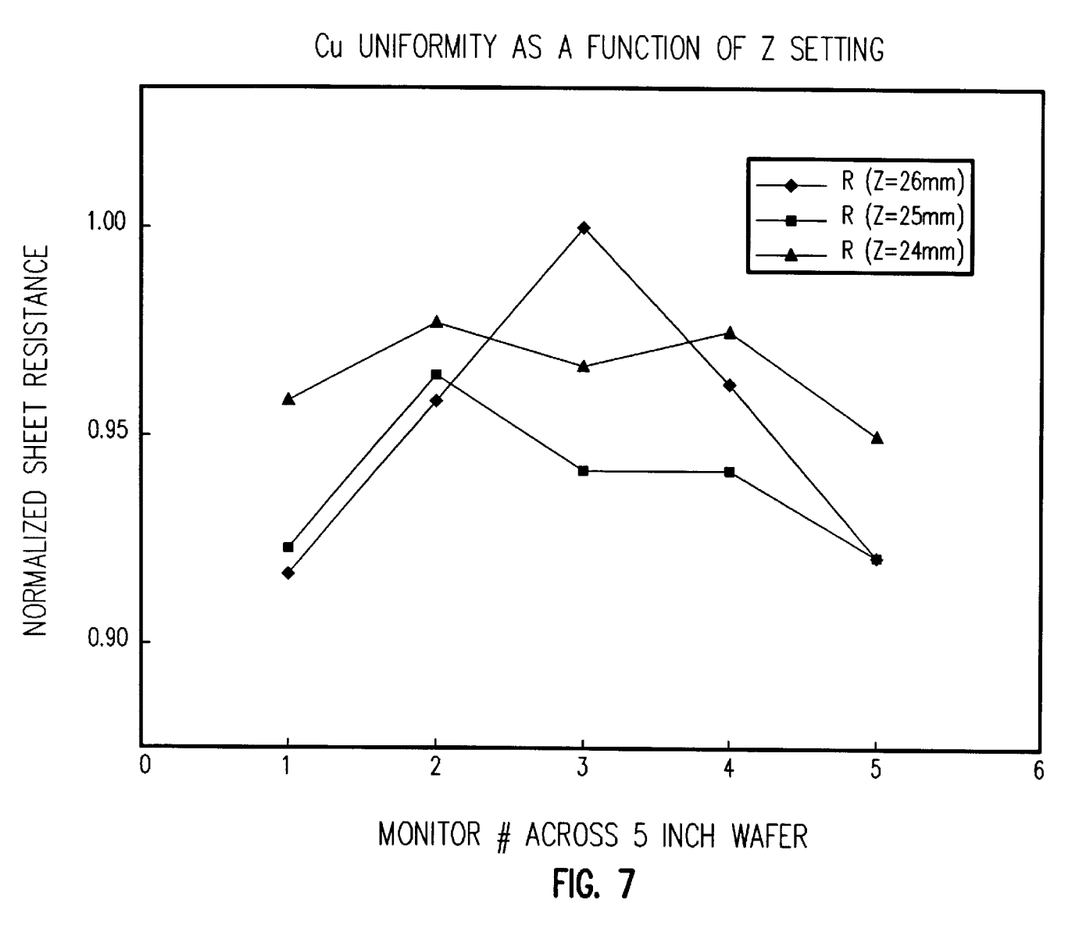
FIG. 7 is a graph showing the copper sheet resistance uniformity across the deposition substrate as a function of Z-setting of the movable flux regulator of the present invention.
Figure 8:
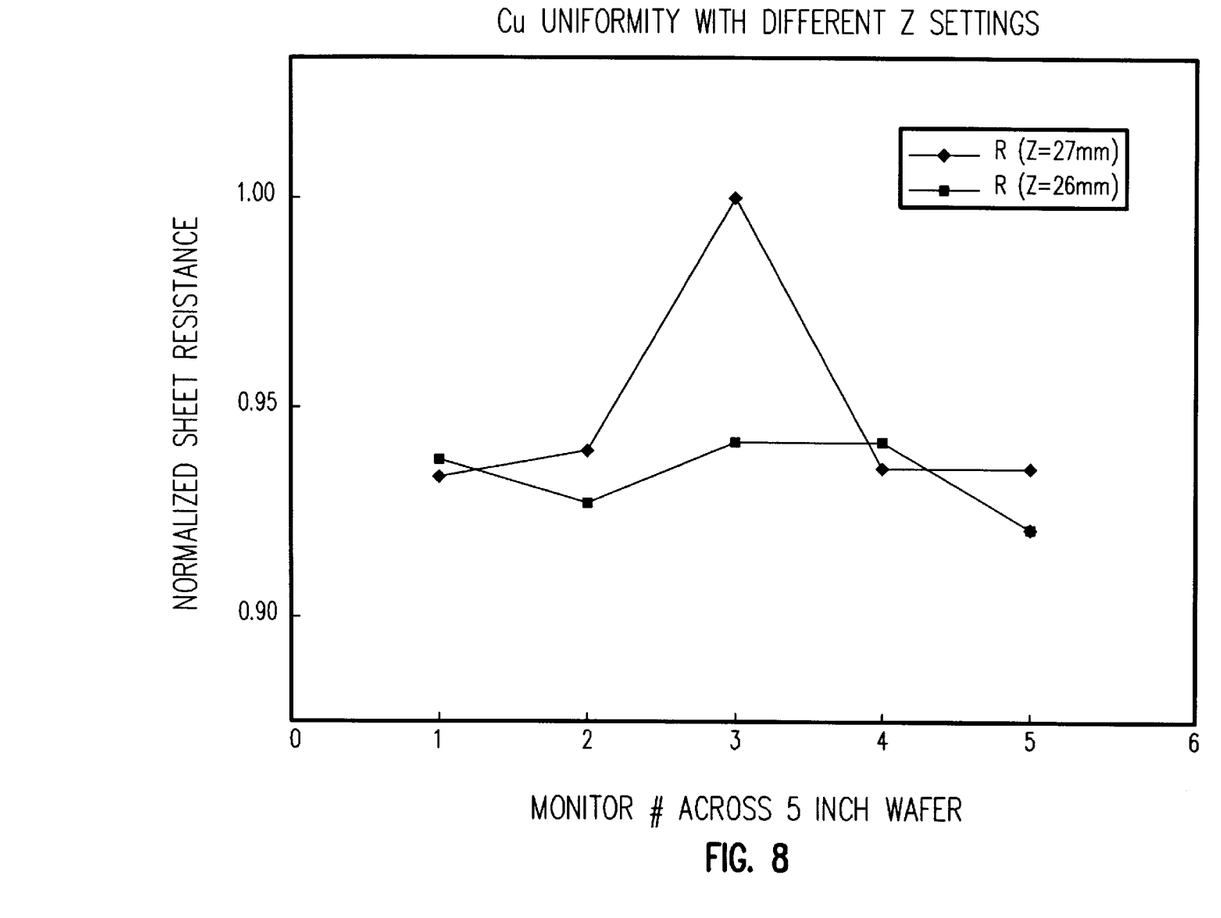
FIG. 8 is a graph showing the cobalt sheet resistance uniformity across the deposition substrate as a function of Z-setting of the movable flux regulator of the present invention.

Referring now to FIGS. 7 and 8, the effects of Z-axis position of the movable flux regulator 650 are shown in graphs of the normalized sheet resistance as a function of location on the substrate for Cu and Co thin film depositions. In FIG. 7, the Cu film uniformity improves significantly from 11.3% to 3.7% as the position of the movable flux regulator is changed from 26 mm to 24 mm in Z direction while holding the position of the movable flux regulator in X and Y directions the same. In FIG. 8, the Co film uniformity improves from 9.0% to 2.7% as the position of the movable flux regulator is changed from 27 mm to 26 mm in Z direction while holding the position of the movable flux regulator in X and Y directions the same.

Referring back to FIGS. 7 and 8, it can be seen that the Z-axis position of the movable flux regulator resulting in improved uniformity of the Cu film is different from the Z-axis position of the movable flux regulator resulting in improved uniformity of the Co film. It is this need to separately fix the flux regulator position for improved uniformity of each of the materials deposited in fabrication of multilayer films that is addressed by the movable flux regulator of the present invention.

According to the present invention, a best embodiment process for depositing uniform thickness layers in a multilayer structure such as SV sensors for magnetic recording devices is described herein below. An ion beam sputter deposition system as described above and illustrated in FIG. 5 is set up with multiple targets 523 on an externally rotatable support (not shown) with a separate target for each material to be deposited for the multilayer structure. For the SV sensor device described above and illustrated in FIG. 2, deposition of the structure in the central region 202 requires targets for the AFM pinning layer, the permalloy (NiFe) for pinned MR layer and free MR layer, the Co interface layer, the Cu spacer layer and the Ru layer if the pinned layer is an AP-pinned layer. The free MR layer material is deposited using the same target as for the ferromagnetic layers of the pinned MR layer. For each target material, in order to achieve the optimum Z-axis setting of the movable flux regulator, an experiment is carried out where a set of thin films are sputter deposited on substrates using a different Z-axis setting for the movable flux regulator 550 for each film. The film thickness uniformity of each film is measured across the substrate diameter using an appropriate measure such as, for example, sheet resistance. The graphs of FIGS. 7 and 8 show results obtained for Cu films and Co films. As a result of carrying out the aforementioned experiments, a setting for the Z-axis position of the movable flux regulator is chosen which achieves the highest thickness uniformity for each layer of material to be deposited on a wafer substrate. The chosen settings for the movable flux regulator are the settings that will be used during subsequent depositions of the multilayers of the MR sensors. For the computer controlled ion beam sputtering system described above, the X-axis, Y-axis, Z-axis, rotational angle φ and the swing angle Θ settings may be used for each material deposition are programmed in the software program used to control the entire sputtering sequence for the multilayer deposition of the SV sensor structure.

Figure 9:
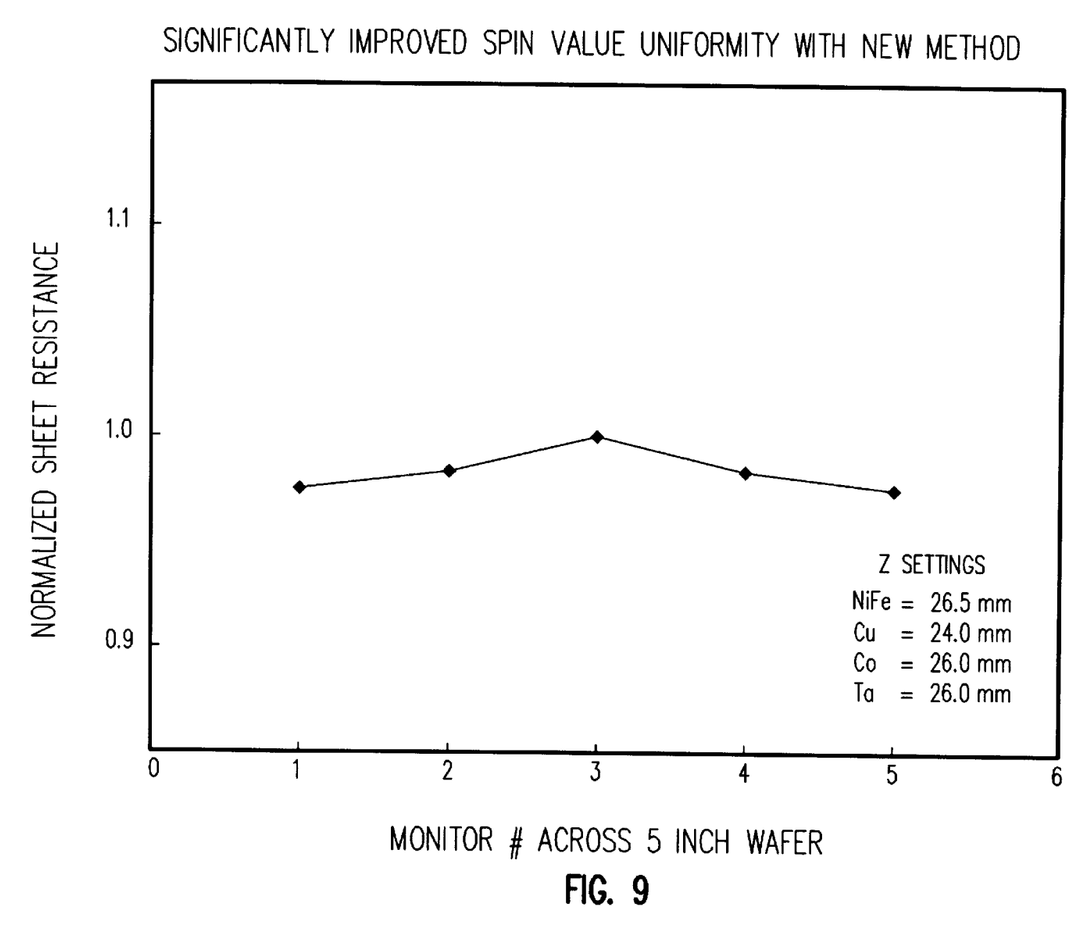
FIG. 9 is a graph showing the SV sensor device sheet resistance uniformity across the deposition substrate manufactured according to the present invention.

Referring now to FIG. 9, there is shown the graph of composite sheet resistance data across the deposition substrate for the complete multilayer SV sensor of FIG. 2 including a Ta protective overlayer built according to the preferred embodiment of the present invention in an ion-beam sputtering system having a movable flux regulator. The SV layers were deposited with the settings for the Z-axis position of the movable flux regulator for each material in the structure as indicated in FIG. 9. During this experiment, the position of the movable flux regulator was fixed in both the X and Y directions while the position of the movable flux regulator was changed in the Z direction. Using the process of the present invention, SV sensor uniformity of less than 5% was achieved over the entire utilized area of a 5 inch diameter wafer. This uniformity can be compared with the prior art RF sputtering SV structures where the uniformity is about 20–30%. The 5% uniformity of the SV sensor structure together with the excellent uniformity of the individual material depositions comprising the SV sensor provide a manufacturable process for these devices using ion beam sputtering methods utilizing the improved positioning (X, Y, Z, swinging through angle Θ and rotation) of the movable flux regulator disclosed herein.

Table I shows uniformity data for ion beam sputtered deposited SV sensors using ion beam system of FIG. 1 having a non-movable flux regulator (fixed X,Y and Z-axis positions for all the deposited layers) and the ion beam sputtering system of the present invention having a movable flux regulator where the position of the movable flux regulator in X and Y directions was fixed and its Z-axis position was optimized for each individual layer deposited. The improved uniformity, especially of the critical Cu layer, seen with the process of the present invention provides a remarkably improved manufacturing process for SV sensors on wafers.

TABLE I

Uniformity of Deposited Layers

|  | Material | Z-Setting (mm) | Uniformity (%) |
|---|---|---|---|
| Applicant's | NiFe | 26 | 3.5 |
| Experiment | Co | 26 | 2.7 |
|  | Cu | 26 | 11.3 |
| THIS INVENTION | NiFe | 26.5 | 1.2 |
|  | Co | 26 | 2.7 |
|  | Cu | 24 | 3.7 |

While the present invention has been particularly shown and described with reference to the preferred embodiment thereof, nevertheless, it will be understood by those skilled in the art that various modifications may be made therein without departing from the spirit, scope, and teaching of the present invention.

For example, a positioning method different from the X, Y, Z Cartesian system, swinging through angle Θ and rotation described herein may be used to achieve equivalent results. For example a positioning system for the movable flux regulator based on a polar coordinate system motions could be employed.

Furthermore, although the ion beam system of the present invention was mainly utilized to improve thickness uniformity of each deposited layer across an MR sensor wafer, the invention is equally applicable to any art that may benefit from improved thickness uniformity of an ion beam sputter deposited layer on a substrate.

Accordingly, it is to be understood that the invention disclosed herein is not to be limited by the illustrated embodiment, but only by the scope of the appended claims.

I claim:

1. An ion-beam sputtering deposition system comprising:
   a vacuum chamber;
   a substrate;
   a target of a material;
   an ion-beam source for directing ions at said target for depositing said material on said substrate; and
   an automatically adjustable movable flux regulator for controlling the uniformity of the target material deposited on said substrate according to a deposition sequence, said movable flux regulator is movable in the direction of X-axis, Y-axis and Z-axis, wherein the movement of the flux regulator is associated with the deposition sequence.

2. The ion-beam sputtering deposition system according to claim 1 wherein said movable flux regulator can further rotate along at least one of said X-axis, Y-axis and Z-axis directions.

3. The ion-beam sputtering deposition system according to claim 1 wherein said movable flux regulator can further swing in a plane of a predefined axis.

4. The ion-beam sputtering deposition system according to claim 1 further comprising a rotating support member for rotating said substrate.

5. The ion-beam sputtering deposition system according to claim 1 further comprising a multiple target holder for holding a plurality of targets, said multiple target holder holding said target of said material.

6. The ion-beam sputtering deposition system according to claim 1 further comprising a rotatable stage for rotating said target.

7. The ion-beam sputtering deposition system according to claim 5 further comprising a rotatable stage for rotating said multiple target holder.

8. An ion-beam sputtering deposition system comprising:
   a vacuum chamber;
   a substrate in said vacuum chamber;
   a target of a material in said vacuum chamber;
   an ion-beam source for directing ions at said target for depositing said material on said substrate; and
   an automatically adjustable movable flux regulator positioned between said target and said substrate for partially blocking a portion of said material from depositing on said substrate according to a deposition sequence, said movable flux regulator is movable in X-axis, Y-axis and Z-axis directions relative to said substrate, wherein the movement of the flux regulator is associated with the deposition sequence.

9. The ion-beam sputtering deposition system according to claim 8, wherein said movable flux regulator can further rotate along at least one of said X-axis, Y-axis and Z-axis directions.

10. The ion-beam sputtering deposition system according to claim 8, wherein said movable flux regulator can further swing in a plane of a predefined axis.

11. The ion-beam sputtering deposition system according to claim 8 further comprising a rotating support member for rotating said substrate.

12. The ion-beam sputtering deposition system according to claim 8 further comprising a multiple target holder for holding a plurality of targets, said multiple target holder holding said target of said material.

13. The ion-beam sputtering deposition system according to claim 8 further comprising a rotatable stage for rotating said target.

14. The ion-beam sputtering deposition system according to claim 12 further comprising a rotatable stage for rotating said multiple target holder.

15. An ion-beam sputtering deposition system comprising:
   a vacuum chamber;
   a substrate in said vacuum chamber;
   a plurality of target materials in said vacuum chamber;
   an ion-beam source for directing ions at said plurality of target materials for sequentially depositing at least one of said target materials on said substrate; and
   an automatically adjustable movable flux regulator positioned between said plurality of target materials and said substrate for controlling the thickness uniformity of each of said plurality of target materials deposited on said substrate according to a deposition sequence, said movable flux regulator is movable in X-axis, Y-axis and Z-axis directions relative to said substrate, wherein the movement of the flux regulator is associated with the deposition sequence.

16. The ion-beam sputtering deposition system according to claim 15, wherein said movable flux regulator position is adjusted before depositing each of said target materials.

17. The ion-beam sputtering deposition system according to claim 15, wherein said movable flux regulator position is adjusted based on the target material being deposited on said substrate.

18. The ion-beam sputtering deposition system according to claim 15, wherein said movable flux regulator can further rotate along at least one of said X-axis, Y-axis and Z-axis directions.

19. The ion-beam sputtering deposition system according to claim 15, wherein said movable flux regulator can further swing in a plane of a predefined axis.

20. The ion-beam sputtering deposition system according to claim 15 further comprising a rotating support member for rotating said substrate.

21. The ion-beam sputtering deposition system according to claim 15 further comprising a rotatable stage for rotating said plurality of target materials.

22. The ion-beam sputtering deposition system according to claim 15 further comprising a multiple target holder for holding a plurality of targets, said multiple target holder holding said plurality of target materials of said material, and a rotatable stage for rotating said multiple target holder.

23. The ion-beam sputtering deposition system according to claim 15 wherein one of said plurality of target materials is copper.

24. The ion-beam sputtering deposition system according to claim 15 wherein one of said plurality of target materials is cobalt.

25. The ion-beam sputtering deposition system according to claim 15 wherein one of said plurality of target materials is Ni—Fe.

26. The ion-beam sputtering deposition system according to claim 15 wherein one of said plurality of target materials is NiMn.

27. The ion-beam sputtering deposition system according to claim 15 wherein one of said plurality of target materials is NiO.

28. The ion-beam sputtering deposition system according to claim 15 wherein one of said plurality of target materials is Ni.

29. The ion-beam sputtering deposition system according to claim 15 wherein one of said plurality of target materials is Ru.

30. In an ion-beam sputtering system having a vacuum chamber, a substrate, a target material, an ion-beam source and an automatically adjustable movable flux regulator for controlling the uniformity of the target material deposited on said substrate, a method of depositing a uniform layer of material on said substrate in said ion-beam sputtering system, comprising the steps of:
    moving said automatically adjustable movable flux regulator to a Cartesian coordinate;
    directing ions at said target material; and
    depositing a portion of said target material on said substrate according to a deposition sequence, wherein the moving of the flux regulator is associated with the deposition sequence.

31. The method according to claim 30 wherein said target material is copper.

32. The method according to claim 30 wherein said target material is cobalt.

33. The method according to claim 30 wherein said target material is Ni—Fe.

34. The method according to claim 30 wherein said target material is Ni.

35. The method according to claim 30 wherein said target material is Ru.

36. The method according to claim 30 wherein said target material is NiMn.

37. In an ion-beam sputtering system having a vacuum chamber, a substrate, a plurality of target materials, an ion-beam source and an automatically adjustable movable flux regulator for controlling the uniformity of the plurality of target materials deposited on said substrate, a method of depositing uniform layers of material on said substrate in said ion-beam sputtering system, comprising the steps of:
    selecting a first target material from said plurality of target materials for depositing on said substrate;
    moving said automatically adjustable movable flux regulator to a first coordinate based on said first target material selected;
    directing ions at said first selected target material for depositing a portion of said first target material on said substrate according to a deposition sequence;
    selecting a second target material from said plurality of target materials for depositing on said substrate;
    moving said movable flux regulator to a second predetermined coordinate based on said second target material selected; and
    directing ions at said second selected target material for depositing a portion of said second target material on said substrate.

38. The method according to claim 37 wherein one of said plurality of target materials is copper.

39. The method according to claim 37 wherein one of said plurality of target materials is cobalt.

40. The method according to claim 37 wherein one of said plurality of target materials is Ni—Fe.

41. The method according to claim 37 wherein one of said plurality of target materials is Ni.

42. The method according to claim 37 wherein said target material is NiO.

43. The method according to claim 37 wherein one of said plurality of target materials is Ru.

44. An ion-beam sputtering deposition system comprising:
    a vacuum chamber;
    a substrate;
    a target of a material;
    an ion-beam source for directing ions at said target for depositing said material on said substrate; and
    an automatically adjustable movable flux regulator for controlling the uniformity of the target material deposited on said substrate according to a deposition sequence, wherein the movement of the flux regulator is associated with the deposition sequence.

45. The ion-beam sputtering deposition system according to claim 44 further comprising a rotating support member for rotating said substrate.

46. The ion-beam sputtering deposition system according to claim 44 further comprising a multiple target holder for holding a plurality of targets, said multiple target holder holding said target of said material.

47. The ion-beam sputtering deposition system according to claim 44 further comprising a rotatable stage for rotating said target.

48. The ion-beam sputtering deposition system according to claim 46 further comprising a rotatable stage for rotating said multiple target holder.

49. An ion-beam sputtering deposition system comprising:
    a vacuum chamber;
    a substrate in said vacuum chamber;
    a target of a material in said vacuum chamber;
    an ion-beam source for directing ions at said target for depositing said material on said substrate; and
    an automatically adjustable swinging flux regulator positioned between said target and said substrate for partially blocking a portion of said material from depositing on said substrate according to a deposition sequence, wherein the positioning of the flux regulator is associated with the deposition sequence.

50. The ion-beam sputtering deposition system according to claim 49, wherein said swinging flux regulator can swing through a predefined angle $\Theta$.

51. The ion-beam sputtering deposition system according to claim 49, wherein said swinging flux regulator can further rotate along its axis.

52. In an ion-beam sputtering system having a vacuum chamber, a substrate, a target material, an ion-beam source and an automatically adjustable swinging flux regulator for controlling the uniformity of the target material deposited on said substrate, a method of depositing a uniform layer of material on said substrate in said ion-beam sputtering system, comprising the steps of:

swinging said automatically adjustable swinging flux regulator relative to said substrate;

directing ions at said target material; and depositing a portion of said target material on said substrate according to a deposition sequence, wherein the swinging of the flux regulator is associated with the deposition sequence.

53. The method according to claim 52, further comprising swinging tie swinging flux regulator through a predefined angle Θ.

54. The method according to claim 52, fuirther comprising rotating the swinging flux regulator along its axis.

55. An ion-beam sputtering deposition system comprising:

a vacuum chamber;

a substrate;

a target of a material;

an ion-beam source for directing ions at said target for depositing said material on said substrate; and an automatically adjustable swinging flux regulator for controlling the uniformity of the target material deposited on said substrate according to a deposition sequence, wherein the swinging of the flux regulator is associated with the deposition sequence.

56. The ion-beam sputtering deposition system according to claim 55, wherein said swinging flux regulator can swing through a predefined angle Θ.

57. The ion-beam sputtering deposition system according to claim 55, wherein the swinging flux regulator can further rotate along its axis.

* * * * *

UNITED STATES PATENT AND TRADEMARK OFFICE
CERTIFICATE OF CORRECTION

PATENT NO.    : 6,197,164 B1                                              Page 1 of 1
DATED         : March 6, 2001
INVENTOR(S)   : Mustafa Pinarbasi It is certified that error appears in the above-identified patent and that said Letters Patent is hereby corrected as shown below:

<u>Title page,</u>
Item [56], References Cited, U.S. PATENT DOCUMENTS, please add
-- 5,330,628    7/1994    Demaray, et al. -- and -- 5,393,398    2/1995    Suzano --.

<u>Column 3,</u>
Line 40, please replace "Is" with -- $I_s$ --.

<u>Column 8,</u>
Line 25, please replace "multiiayers" with -- multilayers --.

<u>Column 12,</u>
Lines 23-24, please replace "said target material" with -- one of said plurality of target materials --.

<u>Column 13,</u>
Line 19, please replace "tie" with -- the --.

Signed and Sealed this

Eighth Day of October, 2002

Attest:

Attesting Officer

JAMES E. ROGAN
*Director of the United States Patent and Trademark Office*